(12) United States Patent
Ko et al.

(10) Patent No.: US 10,847,072 B2
(45) Date of Patent: Nov. 24, 2020

(54) SCAN DRIVER AND DISPLAY APPARATUS USING SAME

(71) Applicant: AU Optronics Corporation, Hsin-Chu (TW)

(72) Inventors: Chien-Chuan Ko, Hsin-Chu (TW); Meng-Chieh Tsai, Hsin-Chu (TW)

(73) Assignee: AU OPTRONICS CORPORATION, Hsin-chu (TW)

( * ) Notice: Subject to any disclaimer, the term of this patent is extended or adjusted under 35 U.S.C. 154(b) by 157 days.

(21) Appl. No.: 16/168,937

(22) Filed: Oct. 24, 2018

(65) Prior Publication Data

US 2019/0130808 A1 May 2, 2019

(30) Foreign Application Priority Data

Oct. 27, 2017 (TW) .............................. 106137266 A

(51) Int. Cl.
*G11C 19/00* (2006.01)
*G09G 3/20* (2006.01)
(Continued)

(52) U.S. Cl.
CPC .............. *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

2015/0179277 A1* 6/2015 Pai ........................... G09G 3/20
377/68
2015/0325181 A1* 11/2015 Wang .................. G09G 3/3677
377/64

(Continued)

*Primary Examiner* — Tuan T Lam
(74) *Attorney, Agent, or Firm* — WPAT, PC

(57) ABSTRACT

A scan driver that includes a plurality of stages of scan driving circuits is provided. Each scan driving circuit includes: a driving transistor, including: a control terminal configured to receive a current-stage scan control signal, a first terminal configured to receive a first clock signal, and a second terminal configured to output a current-stage scan signal; an input stage circuit coupled to the driving transistor, where the input stage circuit includes: a first input transistor and a second input transistor, the first input transistor includes: a control terminal, a first terminal, and a second terminal, the second input transistor includes: a control terminal, a first terminal, and a second terminal, the control terminal of the first input transistor is configured to receive a next-stage scan signal, the control terminal of the second input transistor is configured to receive a previous-stage scan signal, and the second terminal of the first input transistor and the second terminal of the second input transistor are coupled to the control terminal of the driving transistor; a pull-down circuit, coupled to the driving transistor and configured to pull down the current-stage scan control signal and the current-stage scan signal; and a capacitor, coupled to the driving transistor and configured to maintain the current-stage scan control signal, where in a first scan mode, the first terminal of the first input transistor receives the first clock signal, and the first terminal of the second input transistor receives a first scan direction control signal; and in a second scan mode, the first terminal of the first input transistor receives a second scan direction control signal, and the first terminal of the second input transistor receives the first clock signal.

12 Claims, 7 Drawing Sheets

(51) Int. Cl.
*G11C 19/28* (2006.01)
*G09G 3/36* (2006.01)
*G09G 3/3266* (2016.01)

(52) U.S. Cl.
CPC ......... *G09G 3/3266* (2013.01); *G09G 3/3677* (2013.01); *G09G 2310/0202* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2016/0019976 A1* | 1/2016 | Pai | G09G 3/3266 345/204 |
| 2016/0180788 A1 | 6/2016 | Xiao | |
| 2016/0293092 A1* | 10/2016 | Li | G09G 3/2092 |
| 2016/0351156 A1* | 12/2016 | Wu | G11C 19/28 |
| 2017/0269769 A1* | 9/2017 | Hu | G09G 3/20 |
| 2017/0270881 A1* | 9/2017 | Li | G09G 3/3677 |
| 2018/0151148 A1* | 5/2018 | Wu | G11C 19/184 |
| 2018/0174545 A1* | 6/2018 | Li | G09G 3/3696 |
| 2018/0182334 A1* | 6/2018 | Li | G09G 3/3674 |
| 2018/0277044 A1* | 9/2018 | Chen | G09G 3/3677 |

\* cited by examiner

SCAN DRIVER AND DISPLAY APPARATUS USING SAME

BACKGROUND

Technical Field

The present invention relates to a scan driver and a display apparatus using same.

Related Art

Today, as information transmissions become more frequent, demands of display apparatuses are greatly increased. However, in a display apparatus, if a scan driver encounters a problem such as electric leakage or charge capability decline, a level of a scan signal output by the scan driver is not pulled up quickly enough, reducing an operation capability.

Therefore, the present invention provides a scan driver and a display apparatus using same, so as to improve the existing problem or other problems.

SUMMARY

The present invention relates to a scan driver, comprising a plurality of stages of scan driving circuits, wherein each scan driving circuit comprises: a driving transistor, comprising: a control terminal configured to receive a current-stage scan control signal, a first terminal configured to receive a first clock signal, and a second terminal configured to output a current-stage scan signal; an input stage circuit coupled to the driving transistor, wherein the input stage circuit comprises: a first input transistor and a second input transistor, the first input transistor comprises: a control terminal, a first terminal, and a second terminal, the second input transistor comprises: a control terminal, a first terminal, and a second terminal, the control terminal of the first input transistor is configured to receive a next-stage scan signal, the control terminal of the second input transistor is configured to receive a previous-stage scan signal, and the second terminal of the first input transistor and the second terminal of the second input transistor are coupled to the control terminal of the driving transistor; a pull-down circuit, coupled to the driving transistor and configured to pull down the current-stage scan control signal and the current-stage scan signal; and a capacitor, coupled to the driving transistor and configured to maintain the current-stage scan control signal, wherein in a first scan mode, the first terminal of the first input transistor receives the first clock signal, and the first terminal of the second input transistor receives a first scan direction control signal; and in a second scan mode, the first terminal of the first input transistor receives a second scan direction control signal, and the first terminal of the second input transistor receives the first clock signal.

The present invention further relates to a display apparatus, comprising: a pixel array; and a scan driver, comprising a plurality of stages of scan driving circuits that are coupled to and that drive the pixel array, wherein each scan driving circuit comprises: a driving transistor, comprising: a control terminal configured to receive a current-stage scan control signal, a first terminal configured to receive a first clock signal, and a second terminal configured to output a current-stage scan signal; an input stage circuit coupled to the driving transistor, wherein the input stage circuit comprises: a first input transistor and a second input transistor, the first input transistor comprises: a control terminal, a first terminal, and a second terminal, the second input transistor comprises: a control terminal, a first terminal, and a second terminal, the control terminal of the first input transistor is configured to receive a next-stage scan signal, the control terminal of the second input transistor is configured to receive a previous-stage scan signal, and the second terminal of the first input transistor and the second terminal of the second input transistor are coupled to the control terminal of the driving transistor; a pull-down circuit, coupled to the driving transistor and configured to pull down the current-stage scan control signal and the current-stage scan signal; and a capacitor, coupled to the driving transistor and configured to maintain the current-stage scan control signal, wherein in a first scan mode, the first terminal of the first input transistor receives the first clock signal, and the first terminal of the second input transistor receives a first scan direction control signal; and in a second scan mode, the first terminal of the first input transistor receives a second scan direction control signal, and the first terminal of the second input transistor receives the first clock signal.

To better understand the foregoing aspects and other aspects of the present invention, detailed description is made below with reference to the accompanying drawings by using embodiments.

DETAILED DESCRIPTION

The technical words in this specification refer to common words in the art. If some of the words are further described or defined in this specification, the explanations of the words are subject to the descriptions or definitions in this specification. The embodiments in the present disclosure all have one or more technical features. A person of ordinary skill in the art may selectively implement some or all of the technical features of any embodiment, or selectively combine some or all of the technical features of the embodiments under the premise that foregoing operations can be implemented.

Figure 1:
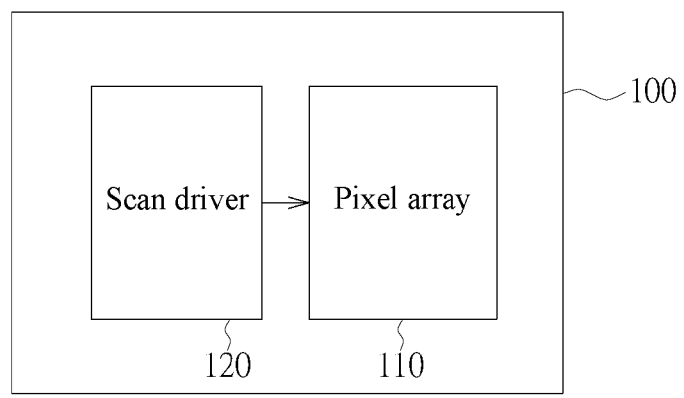
FIG. 1 is a functional block diagram of a display apparatus 100 according to an embodiment of the present invention.

FIG. 1 is a functional block diagram of a display apparatus 100 according to an embodiment of the present invention. As shown in FIG. 1, the display apparatus 100 includes: a pixel array 110 and a scan driver 120. The scan driver 120 includes a plurality of stages of scan driving circuits that are coupled to and that drive the pixel array 110. The pixel array 110 includes a plurality of pixels (not shown) that are arranged as an array. The plurality of stages of scan driving circuits of the scan driver 120 may basically have same or similar circuit architectures. This is described below. In addition, as is known, the scan driver 120 may include a shift register. In some implementations, the scan driver 120 may be directly formed on a substrate of the display apparatus 100 by using a semiconductor process.

Figure 2:
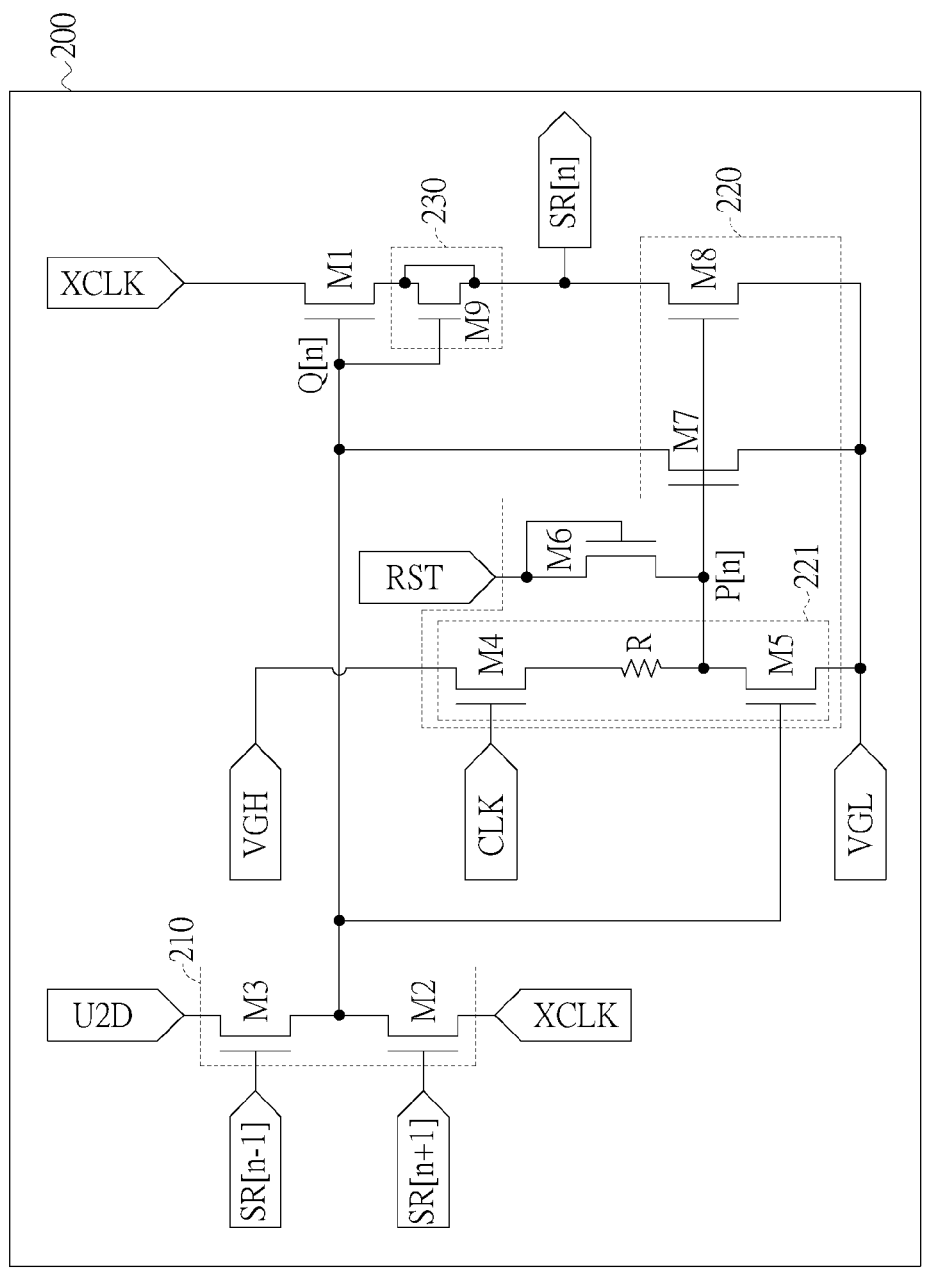
FIG. 2 is a circuit architectural diagram of a scan driving circuit according to a first embodiment of the present invention.

FIG. 2 is a circuit architectural diagram of a scan driving circuit according to a first embodiment of the present invention. In FIG. 2, the scan driving circuit 200 includes: a driving transistor M1, an input stage circuit 210 (including transistors M2 and M3), a pull-down circuit 220 (including transistors M4 to M8), and a capacitor 230 (which, for example, may include a transistor M9).

The driving transistor M1 includes: a control terminal (for example, a gate), configured to receive a current-stage scan control signal Q[n] (that is, a signal on a node Q, where the node Q is a node connecting the input stage circuit 210 to the driving transistor M1); a first terminal (for example, a source/drain, and the following is the same), configured to receive a first clock signal XCLK; and a second terminal (for example, a drain/source), configured to output a current-stage scan signal SR[n].

The input stage circuit 210 is coupled to the driving transistor M1. The input stage circuit includes: a first input transistor M2 and a second input transistor M3. The first input transistor M2 includes: a control terminal, a first terminal, and a second terminal, and the second input transistor M3 includes: a control terminal, a first terminal, and a second terminal. The control terminal of the first input transistor M2 is configured to receive a next-stage scan signal SR[n+1]. The control terminal of the second input transistor M3 is configured to receive a previous-stage scan signal SR[n−1]. The second terminal of the first input transistor M2 and the second terminal of the second input transistor M3 are coupled to the control terminal of the driving transistor M1.

In a first scan mode (for example, forward scanning), the first terminal of the first input transistor M2 receives the first clock signal XCLK, and the first terminal of the second input transistor M3 receives a first scan direction control signal U2D. That is, in the first scan mode, both the first terminal of the first input transistor M2 and the source of the driving transistor M1 receive the first clock signal XCLK.

In a second scan mode (for example, backward scanning), the first terminal of the first input transistor M2 receives a second scan direction control signal (D2U), and the first terminal of the second input transistor M3 receives the first clock signal XCLK. That is, in the second scan mode, both the first terminal of the second input transistor M3 and the source of the driving transistor M1 receive the first clock signal XCLK.

The pull-down circuit 220 is coupled to the driving transistor M1 and is configured to pull down the current-stage scan control signal Q[n] and the current-stage scan signal SR[n]. The pull-down circuit 220 includes: a voltage divider 221, a reset transistor M6, a first pull-down transistor M7, and a second pull-down transistor M8.

The voltage divider 221 is configured to generate a pull-down voltage P[n] according to a first voltage VGL (which, for example, is at a negative voltage level lower than a ground voltage, for example, may be the same as a low level of a clock signal XCLK/CLK) and/or a second voltage VGH (which, for example, is at a positive voltage level higher than a ground voltage, for example, may be the same as a high level of a clock signal XCLK/CLK). The voltage divider 221 includes: a first transistor M4, a second transistor M5, and a resistor R. A resistance of the resistor R is, for example, but not limited to, 400 K ohm.

The first transistor M4 includes: a control terminal, configured to receive a second clock signal CLK; a first terminal, configured to receive a second voltage VGH; and a second terminal, configured to generate the pull-down voltage P[n].

The second transistor M5 includes: a control terminal, configured to receive the current-stage scan control signal Q[n]; a first terminal, configured to receive the first voltage VGL; and a second terminal, configured to generate the pull-down voltage P[n].

The reset transistor M6 is coupled to the first pull-down transistor M7 and the second pull-down transistor M8. The reset transistor M6 resets the pull-down voltage P[n] in response to a reset signal RST. A control terminal and a first terminal of the reset transistor M6 receive the reset signal RST, and a second terminal of the reset transistor M6 is coupled to the pull-down voltage P[n].

The first pull-down transistor M7 is coupled to the voltage divider 221, and the first pull-down transistor M7 determines, according to the pull-down voltage P[n], whether to pull down the current-stage scan control signal Q[n]. A control terminal of the first pull-down transistor M7 receives the pull-down voltage P[n], a first terminal receives the current-stage scan control signal Q[n], and a second terminal receives the first voltage VGL.

The second pull-down transistor M8 is coupled to the voltage divider 221, and the second pull-down transistor M8 determines, according to the pull-down voltage P[n], whether to pull down the current-stage scan signal SR[n]. A control terminal of the second pull-down transistor M8 receives the pull-down voltage P[n], a first terminal receives the current-stage scan signal SR[n], and a second terminal receives the first voltage VGL.

When the transistor M4 is on (because the clock signal CLK is at a high level) and the transistor M5 is off (because the current-stage scan control signal Q[n] is pulled down to L), after voltage division is performed, the bleeder voltage P[n] is at a high level H− (which is slightly lower than VGH), the first pull-down transistor M7 is on to reset the current-stage scan control signal Q[n] (because the first pull-down transistor M7 pulls down the current-stage scan control signal Q[n] to be at the first low voltage VGL), and the second pull-down transistor M8 is on to reset the current-stage scan signal SR[n] (because the second pull-down transistor M8 pulls down the current-stage scan signal SR[n] to be at the first low voltage VGL).

The capacitor 230 is coupled to the driving transistor M1 and is configured to maintain the current-stage scan control signal Q[n]. Specifically, a gate of the transistor M9 included in the capacitor 230 is coupled to the current-stage scan control signal Q[n], a first terminal and a second terminal are mutually coupled, the first terminal is coupled to the driving transistor M1, and the second terminal is coupled to the current-stage scan signal SR[n].

Figure 3:
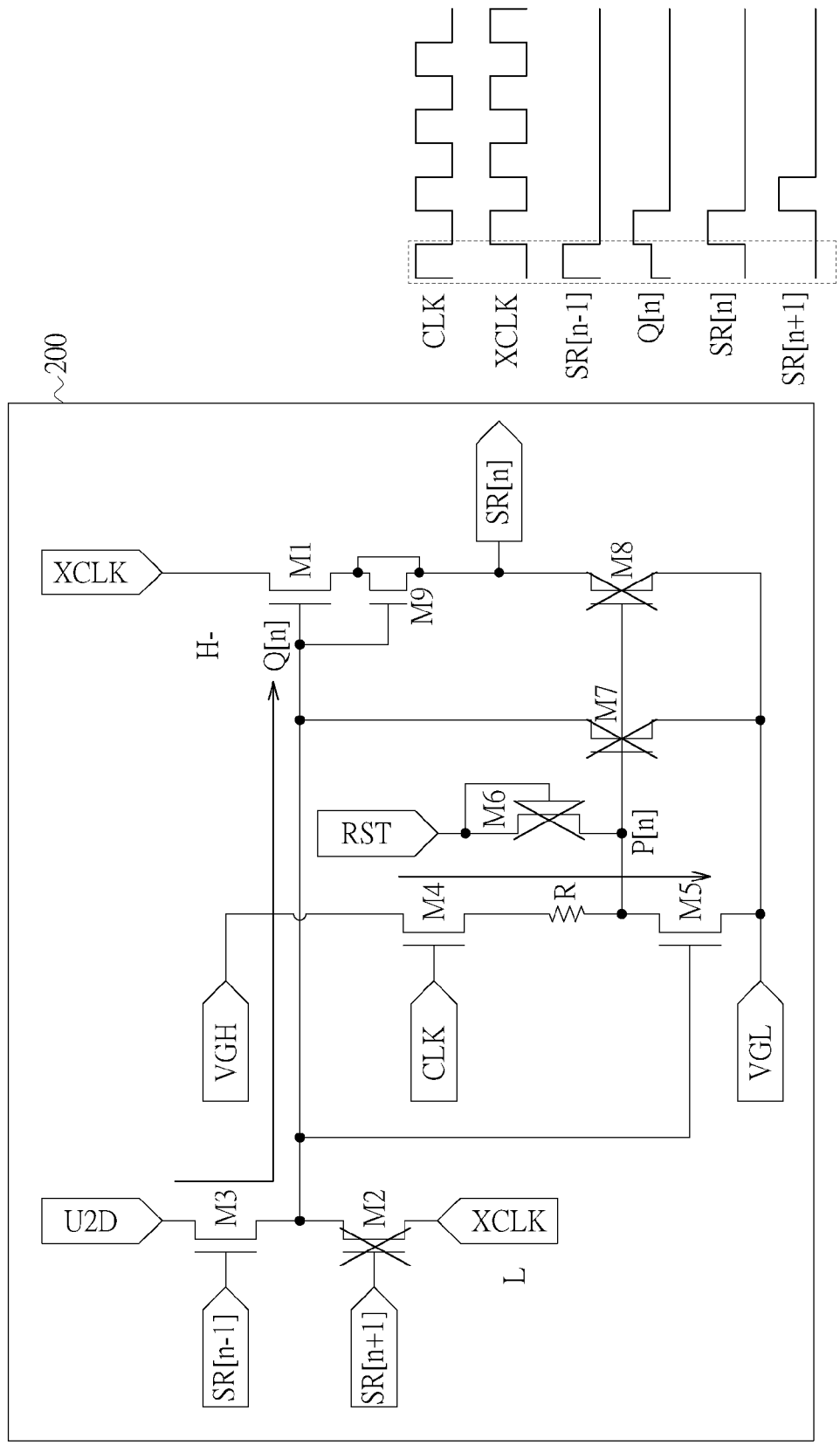
FIG. 3 is a schematic diagram of an operation during a first charging phase in a first scan mode (forward scanning) according to the first embodiment of the present invention.

Referring to FIG. 3, FIG. 3 is a schematic diagram of an operation during a first charging phase in a first scan mode (forward scanning) according to the first embodiment of the present invention.

In the first scan mode (forward scanning), during the first charging phase (which may also be referred to as a pre-charging phase), when the previous-stage scan signal SR[n−1] is at a high level, the second input transistor M3 is on to charge the current-stage scan control signal Q[n] to be at a first level (In FIG. 3, a level of Q[n] in this phase is marked as H−, because H− is slightly lower than U2D (U2D is at a high level VGH)). Because the current-stage scan control signal Q[n] is charged to be at the first level, the driving transistor M1 is on (but the current-stage scan signal SR[n] is not pulled up). In addition, in this case, because the next-stage scan signal SR[n+1] is at a low level, the first input transistor M2 is off.

In addition, in the pull-down circuit 220, the first transistor M4 is on (because the clock signal CLK is at a high level) and the second transistor M5 is also on (because the current-stage scan control signal Q[n] is charged to be at the first level H−), so that after voltage division is performed, the bleeder voltage P[n] is at a low level. As a result, the reset transistor M6, the pull-down transistor M7 and the pull-down transistor M8 are off.

Figure 4:
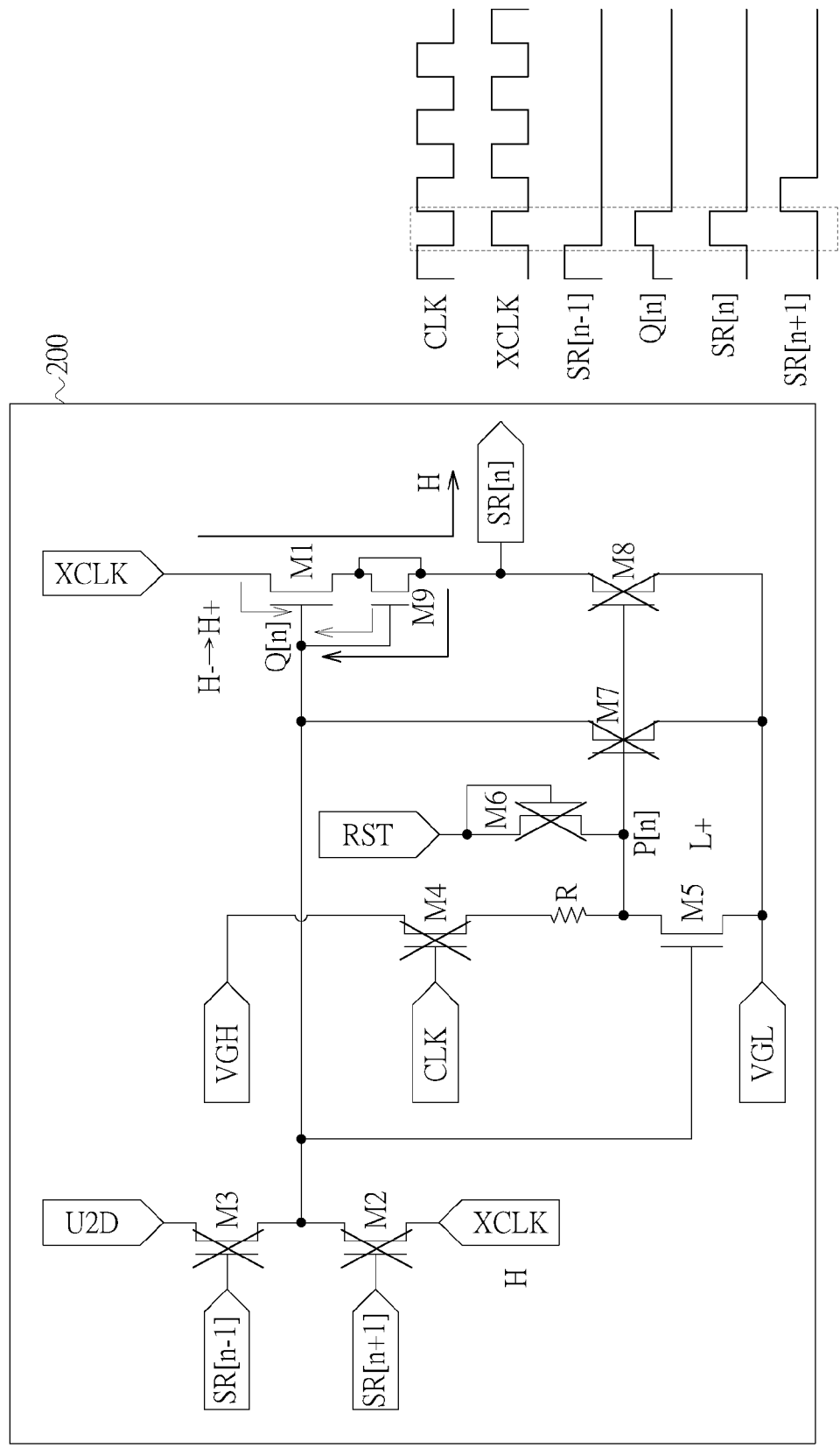
FIG. 4 is a schematic diagram of an operation during a second charging phase in a first scan mode (forward scanning) according to the first embodiment of the present invention.

Referring to FIG. 4, FIG. 4 is a schematic diagram of an operation during a second charging phase in a first scan mode (forward scanning) according to the first embodiment of the present invention. In the first scan mode, during the second charging phase, the first clock signal XCLK is at a high level, the previous-stage scan signal SR[n−1] and the next-stage scan signal SR[n+1] are at low levels, so that the input transistor M2 and the input transistor M3 are off. The current-stage scan control signal Q[n] is maintained at a high level H− (because of the capacitor 230), so that the driving transistor M1 that is on in the previous phase may pull up the current-stage scan signal SR[n]. Because of a capacitive coupling effect, the current-stage scan control signal Q[n] is pulled up from the high level H− to H+ (H+ is higher than H−).

In addition, the second transistor M5 is on (because the current-stage scan control signal Q[n] is at a high level) and the first transistor M4 is off (because the clock signal CLK is at a low level), so that after voltage division is performed, the bleeder voltage P[n] is at a low level L+(which is slightly higher than VGL). In this case, the transistors M6 to M8 are still off.

Figure 5:
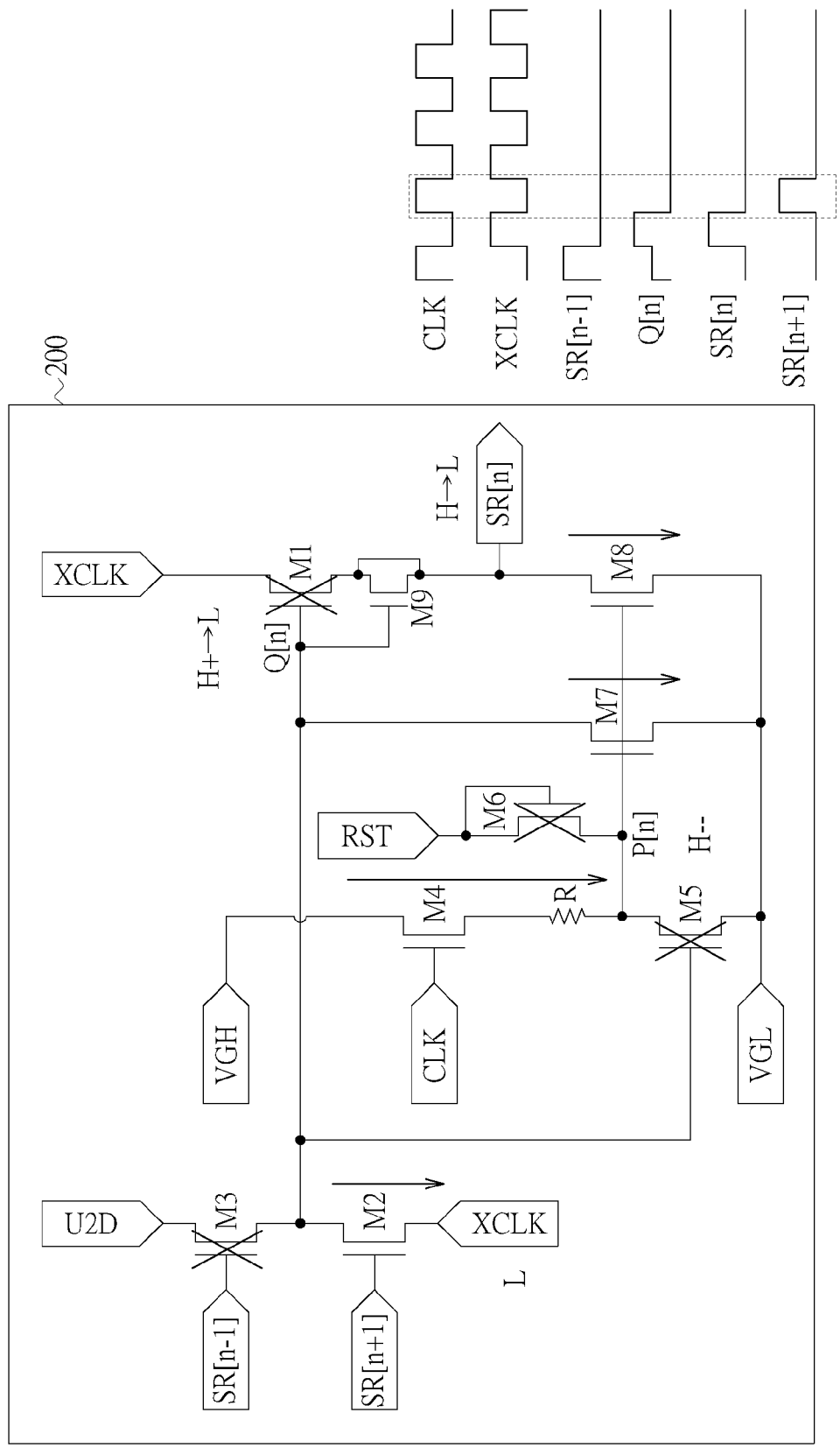
FIG. 5 is a schematic diagram of an operation during a discharging phase in a first scan mode (forward scanning) according to the first embodiment of the present invention.

Referring to FIG. 5, FIG. 5 is a schematic diagram of an operation during a discharging phase in a first scan mode (forward scanning) according to the first embodiment of the present invention. During the discharging phase in the first scan mode, the next-stage scan signal SR[n+1] is at a high level, so that the first input transistor M2 is off, to pull down the current-stage scan control signal Q[n] (from H+ to L). Therefore, the driving transistor M1 is off.

The first transistor M4 is on (because the clock signal CLK is at a high level) and the second transistor M5 is off (because the current-stage scan control signal Q[n] is pulled down to L), so that after voltage division is performed, the bleeder voltage P[n] is at a high level (H−, which is slightly lower than VGH). As a result, the pull-down transistors M7 and M8 are on. That the pull-down transistor M7 is on can help to pull down the current-stage scan control signal Q[n] to be at a low level, and that the pull-down transistor M8 is on can pull down the current-stage scan signal SR[n] (that is, discharging).

Figure 6:
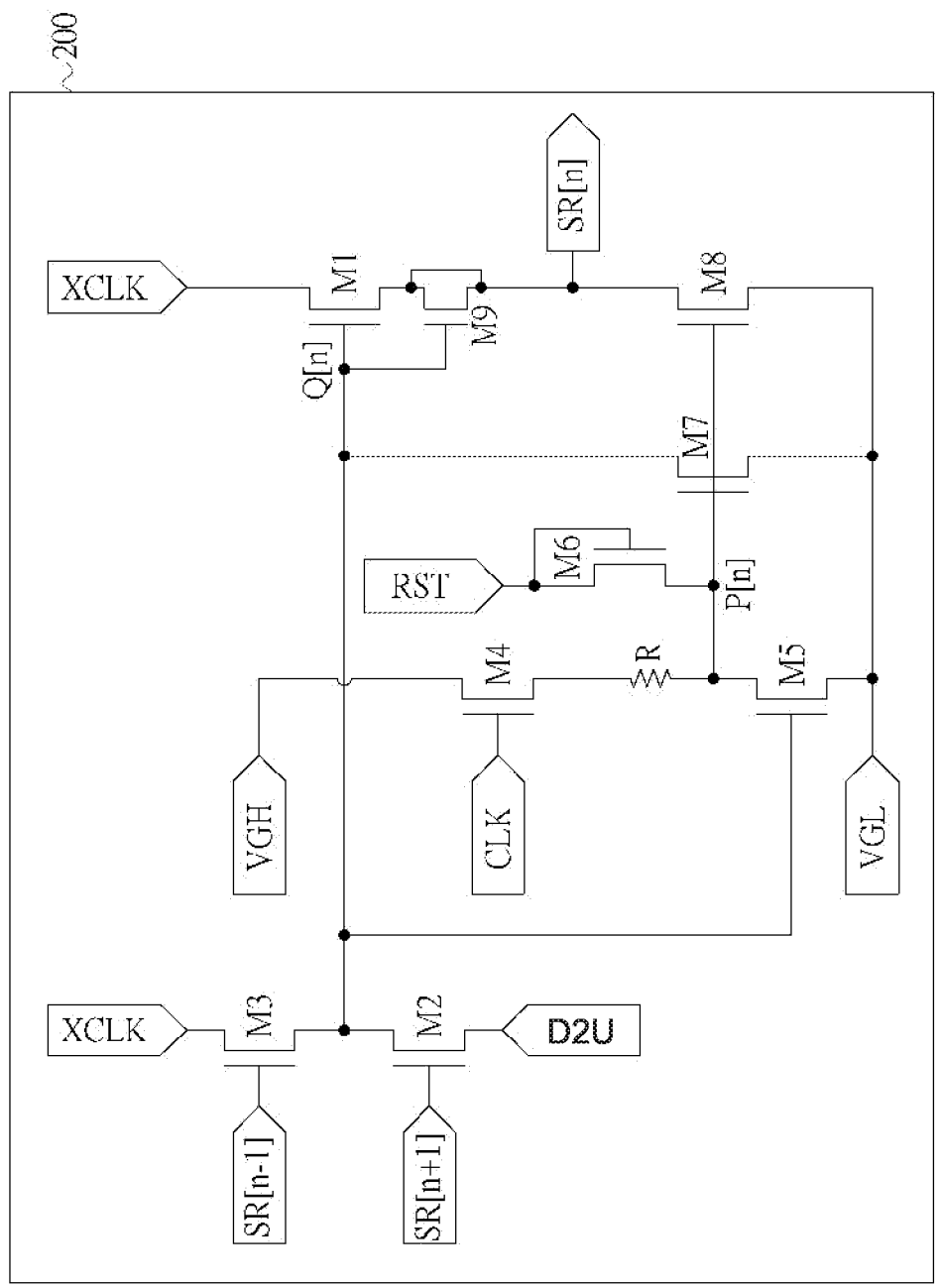
FIG. 6 is a schematic diagram of a second scan mode (backward scanning) according to the first embodiment of the present invention.

Referring to FIG. 6, FIG. 6 is a schematic diagram of a second scan mode (backward scanning) according to the first embodiment of the present invention. In the second scan mode (backward scanning), a source of the first input transistor M2 receives the second scan direction control signal D2U, and the first terminal of the second input transistor M3 receives the first clock signal XCLK. In the first embodiment of the present invention, for an operation of each transistor during a first charging phase, a second charging phase, and a discharging phase in the backward scanning mode, refer to the foregoing descriptions, and details are not described herein again.

Figure 7:
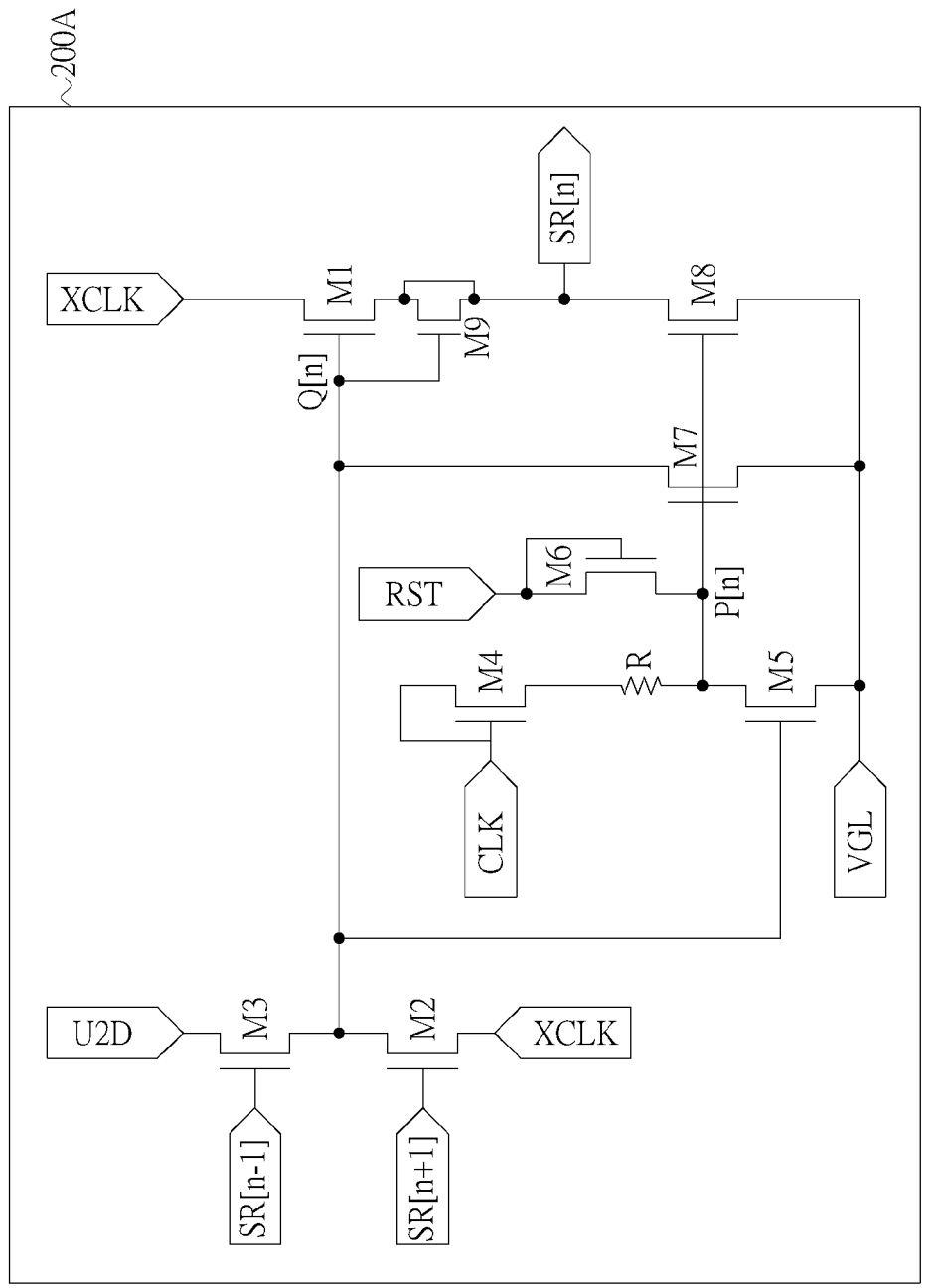
FIG. 7 is a circuit architectural diagram of a scan driving circuit 200A according to a second embodiment of the present invention.

FIG. 7 is a circuit architectural diagram of a scan driving circuit 200A according to a second embodiment of the present invention. Different from FIG. 2, in the scan driving circuit 200A according to the second embodiment of the present invention, the first transistor M4 is of a diode connection architecture, that is, the control terminal and the first terminal of the first transistor M4 are mutually coupled and are coupled to the clock signal CLK. Because the first transistor M4 is of the diode connection architecture, during the second charging phase in the first scan mode (forward scanning) or the second scan mode (backward scanning), a leakage current of the first pull-down transistor M7 may further be reduced.

In the second embodiment of the present invention, for an operation during each phase in the first scan mode (forward scanning) or the second scan mode (backward scanning), refer to the first embodiment, and details are not described herein again.

Based on the above, the present invention has been disclosed through the embodiments. However, the embodiments are not intended to limit the present invention. A person of ordinary skill in the art can make various modifications and improvements without departing from the spirit and scope of the present invention. Therefore, the protection scope of the present invention should be subject to the scope defined by the claims.

What is claimed is:

1. A scan driver, comprising:
a plurality of stages of scan driving circuits, wherein each scan driving circuit comprises:
a driving transistor, comprising a control terminal for receiving a current-stage scan control signal, a first terminal for receiving a first clock signal, and a second terminal for outputting a current-stage scan signal;
an input stage circuit, coupled to the driving transistor, comprising a first input transistor and a second input transistor, wherein the first input transistor comprises a control terminal, a first terminal, and a second terminal, the second input transistor comprises a control terminal, a first terminal, and a second terminal, and wherein the control terminal of the first input transistor receives a next-stage scan signal, the control terminal of the second input transistor receives a previous-stage scan signal, and the second terminal of the first input transistor and the second terminal of the second input transistor are coupled to the control terminal of the driving transistor;
a pull-down circuit, coupled to the driving transistor and for pulling down the current-stage scan control signal and the current-stage scan signal; and
a capacitor, coupled to the driving transistor and for maintaining the current-stage scan control signal;
wherein under a first scan mode, the first terminal of the first input transistor receives the first clock signal, and the first terminal of the second input transistor receives a first scan direction control signal; and
wherein under a second scan mode, the first terminal of the first input transistor receives a second scan direction control signal, and the first terminal of the second input transistor receives the first clock signal.

2. The scan driving circuit according to claim 1, wherein under the first scan mode, during a first charging phase, the second input transistor charges the current-stage scan control signal to be at a first level when the previous-stage scan signal is at a high level.

3. The scan driving circuit according to claim 2, wherein under the first scan mode, during a second charging phase, when the first clock signal is at the high level, the current-stage scan control signal is at a second level, the driving transistor outputs the current-stage scan signal, and the second level is higher than the first level.

4. The scan driving circuit according to claim 2, wherein under the first scan mode, during a discharging phase, when the next-stage scan signal is at the high level, the first input transistor is on to pull down the current-stage scan control signal, and the pull-down circuit pulls down the current-stage scan control signal and the current-stage scan signal.

5. The scan driving circuit according to claim 1, wherein the pull-down circuit comprises:
a voltage divider, for generating a pull-down voltage according to a first voltage or a second voltage;
a first pull-down transistor coupled to the voltage divider, wherein the first pull-down transistor determines, according to the pull-down voltage, whether to pull down the current-stage scan control signal;
a second pull-down transistor coupled to the voltage divider, wherein the second pull-down transistor determines, according to the pull-down voltage, whether to pull down the current-stage scan signal; and
a reset transistor coupled to the first pull-down transistor and the second pull-down transistor, wherein the reset transistor resets the pull-down voltage in response to a reset signal, and in response to resetting the pull-down voltage, the first pull-down transistor resets the current-stage scan control signal, and the second pull-down transistor resets the current-stage scan signal.

6. The scan driving circuit according to claim 5, wherein the voltage divider comprises:
a first transistor, comprising a control terminal, a first terminal, and a second terminal, wherein the first terminal receives a second clock signal, and the second terminal generates the pull-down voltage; and
a second transistor, comprising a control terminal, a first terminal, and a second terminal, wherein the control terminal receives the current-stage scan control signal, the first terminal receives the first voltage, and the second terminal generates the pull-down voltage.

7. A display apparatus, comprising:
a pixel array; and
a scan driver, comprising a plurality of stages of scan driving circuits coupled to and drive the pixel array, wherein each scan driving circuit comprises:
a driving transistor comprising a control terminal for receiving a current-stage scan control signal, a first terminal for receiving a first clock signal, and a second terminal for outputting a current-stage scan signal;
an input stage circuit coupled to the driving transistor, comprising a first input transistor and a second input transistor, wherein the first input transistor comprises a control terminal, a first terminal, and a second terminal, and the second input transistor comprises a control terminal, a first terminal, and a second terminal, and wherein the control terminal of the first input transistor receives a next-stage scan signal, the control terminal of the second input transistor receives a previous-stage scan signal, and the second terminal of the first input transistor and the second terminal of the second input transistor are coupled to the control terminal of the driving transistor;
a pull-down circuit, coupled to the driving transistor and for pulling down the current-stage scan control signal and the current-stage scan signal; and
a capacitor, coupled to the driving transistor and for maintaining the current-stage scan control signal;
wherein under a first scan mode, the first terminal of the first input transistor receives the first clock signal, and the first terminal of the second input transistor receives a first scan direction control signal; and
wherein under a second scan mode, the first terminal of the first input transistor receives a second scan direction control signal, and the first terminal of the second input transistor receives the first clock signal.

8. The display apparatus according to claim 7, wherein under the first scan mode, during a first charging phase, the second input transistor charges the current-stage scan control signal to be at a first level when the previous-stage scan signal is at a high level.

9. The display apparatus according to claim 8, wherein under the first scan mode, during a second charging phase, the first clock signal is at the high level, the current-stage scan control signal is at a second level, and the driving transistor outputs the current-stage scan signal, wherein the second level is higher than the first level.

10. The display apparatus according to claim 8, wherein under the first scan mode, during a discharging phase, the next-stage scan signal is at the high level, the first input transistor is on for pulling down the current-stage scan control signal, and the pull-down circuit pulls down the current-stage scan control signal and the current-stage scan signal.

11. The display apparatus according to claim 7, wherein the pull-down circuit comprises:
a voltage divider, for generating a pull-down voltage according to a first voltage or a second voltage;
a first pull-down transistor coupled to the voltage divider, wherein the first pull-down transistor determines, according to the pull-down voltage, whether to pull down the current-stage scan control signal;
a second pull-down transistor coupled to the voltage divider, wherein the second pull-down transistor determines, according to the pull-down voltage, whether to pull down the current-stage scan signal; and
a reset transistor coupled to the first pull-down transistor and the second pull-down transistor, wherein the reset transistor resets the pull-down voltage in response to a reset signal, and in response to resetting the pull-down voltage, the first pull-down transistor resets the current-stage scan control signal, and the second pull-down transistor resets the current-stage scan signal.

12. The display apparatus according to claim 11, wherein the voltage divider comprises:
a first transistor, comprising a control terminal, a first terminal, and a second terminal, wherein the first terminal receives a second clock signal, and the second terminal generates the pull-down voltage; and
a second transistor, comprising a control terminal, a first terminal, and a second terminal, wherein the control terminal receives the current-stage scan control signal, the first terminal receives the first voltage, and the second terminal generates the pull-down voltage.

* * * * *